United States Patent
Aamodt et al.

(10) Patent No.: US 12,543,282 B2
(45) Date of Patent: Feb. 3, 2026

(54) FEEDTHROUGH WITH VENT HOLE

(71) Applicant: Medtronic, Inc., Minneapolis, MN (US)

(72) Inventors: Paul B. Aamodt, Prior Lake, MN (US); Lea A. Nygren, Bloomington, MN (US)

(73) Assignee: Medtronic, Inc., Minneapolis, MN (US)

(*) Notice: Subject to any disclaimer, the term of this patent is extended or adjusted under 35 U.S.C. 154(b) by 91 days.

(21) Appl. No.: 18/418,728

(22) Filed: Jan. 22, 2024

(65) Prior Publication Data
US 2024/0251516 A1     Jul. 25, 2024

Related U.S. Application Data

(60) Provisional application No. 63/440,749, filed on Jan. 24, 2023.

(51) Int. Cl.
| | |
|---|---|
| *H05K 5/00* | (2025.01) |
| *H05K 5/02* | (2006.01) |
| *H05K 5/06* | (2006.01) |

(52) U.S. Cl.
CPC ............. *H05K 5/0247* (2013.01); *H05K 5/06* (2013.01)

(58) Field of Classification Search
CPC .............................. H05K 5/0247; H05K 5/06
See application file for complete search history.

(56) References Cited

U.S. PATENT DOCUMENTS

| | | | |
|---|---|---|---|
| 5,842,275 A | 12/1998 | McMillan, II et al. | |
| 7,046,499 B1 * | 5/2006 | Imani ................. | H01G 9/10 |
| | | | 361/306.1 |
| 10,880,009 B2 | 12/2020 | DiDonato | |
| 2003/0192942 A1 | 10/2003 | Humpston et al. | |
| 2005/0263324 A1 | 12/2005 | Wong et al. | |
| 2013/0231718 A1 * | 9/2013 | Imani ................. | H01R 13/7195 |
| | | | 29/857 |
| 2018/0077791 A1 * | 3/2018 | Barry ................. | H05K 5/04 |

\* cited by examiner

*Primary Examiner* — Pete T Lee

(57) ABSTRACT

A feedthrough plate may include a first major surface, a second major surface opposite the first major surface, a side surface disposed between the first major surface and the second major surface, a recess, and a vent hole. The recess may extend from the first major surface to a recessed surface. Furthermore, the recessed surface may be disposed between the first major surface and the second major surface. The vent hole may extend from the side surface to the recess. Additionally, the vent hole may be in fluid communication with at least a portion of the recess.

19 Claims, 9 Drawing Sheets

FEEDTHROUGH WITH VENT HOLE

RELATED APPLICATIONS

This application claims the benefit of U.S. Provisional Application Ser. No. 63/440,749, filed Jan. 24, 2023, the entire contents of each of which are incorporated herein by reference.

TECHNICAL FIELD

This disclosure generally relates to electrical components for hermetically sealed devices and feedthrough assemblies of such devices.

BACKGROUND

Various systems require electrical coupling between electrical devices disposed within a sealed enclosure or housing and devices or systems external to the enclosure. Oftentimes, such electrical coupling needs to withstand various environmental factors such that a conductive pathway or pathways from the external surface of the enclosure to within the enclosure remains stable. For example, implantable medical devices (IMDs), e.g., cardiac pacemakers, defibrillators, neurostimulators, and drug pumps, which include electronic circuitry and one or more power sources, require an enclosure or housing to contain and seal these elements within a body of a patient. Many of these IMDs include one or more electrical components such as, for example, feedthrough assemblies to provide electrical connections between the elements contained within the housing and components of the IMD external to the housing, for example, one or more sensors, electrodes, and lead wires mounted on an exterior surface of the housing, or electrical contacts housed within a connector header, which is mounted on the housing to provide coupling for one or more implantable leads.

Feedthrough assemblies or components may include one or more feedthrough plates. Feedthrough plates may include one or more through-holes that can accommodate feedthrough conductors or other conductive elements that can be used to provide electrical connections between elements contained in a sealed housing and components external to the sealed housing.

SUMMARY

The techniques of this disclosure generally relate to feedthrough plates for feedthrough assemblies or components. Feedthrough plates may include one or more through-holes that extend between opposing surfaces of the feedthrough plate to allow feedthrough conductors to extend from one side of the feedthrough plate to the other. In general, when a feedthrough component is formed using a feedthrough plate, the feedthrough conductors may be electrically insulated from the feedthrough plate using insulative material to allow each feedthrough conductor to provide a conductive pathway for power or other signals. Additionally, the insulative material may provide a hermetic seal within the through-holes to prevent ingress of external contaminants from passing through the through-holes and into a housing of a device.

The feedthrough plate may also include at least one recess to allow a pin or other conductor to be securely coupled, electrically and/or mechanically, to the feedthrough plate. The recess may extend from one of the opposing surfaces to a recessed surface disposed between the opposing surfaces. In contrast with typical recesses for electrical connections to feedthrough plates, the feedthrough plates described herein may include a vent hole extending from a side surface to the recess. The vent hole may provide a fluid pathway out of the recess that extends away from anything disposed in the recess. Accordingly, when a conductor is attached to the feedthrough plate in the recess, fluid located inside the recess may escape via the vent hole as it expands preventing the conductor and attachment material from being pushed out of the recess. Thus, feedthrough plates that include vent holes as described herein may prevent conditions that may result in a poor electrical and/or mechanical connection of conductors in recesses.

In one example, aspects of this disclosure relate to a feedthrough component comprising a feedthrough plate and a conductive element. The feedthrough plate may comprise a first major surface, a second major surface opposite the first major surface, a side surface disposed between the first major surface and the second major surface, at least one through hole, a recess, and a vent hole. The at least one through hole may extend through the feedthrough plate from the first major surface to the second major surface. The recess may extend from the first major surface to a recessed surface. The recessed surface may be disposed between the first major surface and the second major surface. The vent hole may extend from the side surface to the recess. Additionally, the vent hole may be in fluid communication with at least a portion of the recess. The conductive element may be at least partially disposed in the recess and electrically coupled to the feedthrough plate.

In another example, aspects of this disclosure relate to a feedthrough plate comprising a first major surface, a second major surface opposite the first major surface, a side surface disposed between the first major surface and the second major surface, at least one through hole, a recess, and a vent hole. The at least one through hole may extend through the feedthrough plate from the first major surface to the second major surface. The recess may extend from the first major surface to a recessed surface. The recessed surface may be disposed between the first major surface and the second major surface. The vent hole may extend from the side surface to the recess. Additionally, the vent hole may be in fluid communication with at least a portion of the recess.

In another example, aspects of this disclosure relate to an implantable medical device comprising a housing, a feedthrough component, and one or more electrical components disposed in the housing. The feedthrough component may be welded to the device housing to form a hermetic seal. The feedthrough component may comprise a feedthrough plate and an conductive element. The feedthrough plate may comprise a first major surface, a second major surface opposite the first major surface, a side surface disposed between the first major surface and the second major surface, at least one through hole, a recess, and a vent hole. The at least one through hole may extend through the feedthrough plate from the first major surface to the second major surface. The recess may extend from the first major surface to a recessed surface. The recessed surface may be disposed between the first major surface and the second major surface. The vent hole may extend from the side surface to the recess. Additionally, the vent hole may be in fluid communication with at least a portion of the recess. The conductive element may be at least partially disposed in the recess and electrically coupled to the feedthrough plate. The one or more electrical components may be operatively coupled to the conductive element of the feedthrough component.

All headings provided herein are for the convenience of the reader and should not be used to limit the meaning of any text that follows the heading, unless so specified.

The terms "comprises" and variations thereof do not have a limiting meaning where these terms appear in the description and claims. Such terms will be understood to imply the inclusion of a stated step or element or group of steps or elements but not the exclusion of any other step or element or group of steps or elements.

In this application, terms such as "a," "an," and "the" are not intended to refer to only a singular entity but include the general class of which a specific example may be used for illustration. The terms "a," "an," and "the" are used interchangeably with the term "at least one." The phrases "at least one of" and "comprises at least one of" followed by a list refers to any one of the items in the list and any combination of two or more items in the list.

As used herein, the term "or" is generally employed in its usual sense including "and/or" unless the content clearly dictates otherwise.

The term "and/or" means one or all of the listed elements or a combination of any two or more of the listed elements.

As used herein in connection with a measured quantity, the term "about" refers to that variation in the measured quantity as would be expected by the skilled artisan making the measurement and exercising a level of care commensurate with the objective of the measurement and the precision of the measuring equipment used. Herein, "up to" a number (e.g., up to 50) includes the number (e.g., 50).

Also herein, the recitations of numerical ranges by endpoints include all numbers subsumed within that range as well as the endpoints (e.g., 1 to 5 includes 1, 1.5, 2, 2.75, 3, 3.80, 4, 5, etc.)

The details of one or more aspects of the disclosure are set forth in the accompanying drawings and the description below. Other features, objects, and advantages of the techniques described in this disclosure will be apparent from the description and drawings, and from the claims.

DETAILED DESCRIPTION

In general, the present disclosure provides various embodiments of feedthrough plates that include a recess and a vent hole and devices and systems that include such feedthrough plates. The feedthrough plates described herein may include a vent hole that prevents pressure differentials from developing that may displace melted attachment material and conductive elements positioned in a recess during an attachment process. Accordingly, feedthrough plates with a vent hole may allow for more robust electrical and mechanical coupling of conductive elements in recesses compared to feedthrough plates that do not include such vent holes.

Typical feedthrough plates may not include a vent hole in fluid communication with a recess intended to receive a conductive element. During attachment processes, attachment material (e.g., solder or brazing material) may flow around the conductive element and into the recess in a manner such that the conductive attachment material traps fluid (e.g., air, gas, etc.) within the recess. As the trapped fluid is heated by the attachment process, the trapped fluid may expand causing attachment material and/or the conductive element to be pushed out of the recess. In other words, fluid trapped in the recess during an attachment process may cause the attachment material to erupt from the recess that may also displace the conductive element from being positioned in the recess. Furthermore, expansion of trapped fluid in the recess may cause attachment material to be disposed on the feedthrough plate outside of the recess that is not firmly adhered to any surface and is at risk for becoming loose. Loose deposits of attachment material may migrate to undesirable areas and may create unwanted electrical connections.

The use of a vent hole that extends from a side surface of the feedthrough plate may provide a fluid pathway for fluid to expand and escape the recess during attachment processes. As attachment material is melted and fills the recess, fluid may escape through the vent hole rather than pushing attachment material and the elongated conductor out of the recess. Accordingly, the vent hole may allow for more robust electrical and mechanical coupling of conductive elements to the feedthrough plate and prevent formation of loose deposits of attachment material. Additionally, the vent hole may allow for easier removal of debris formed during formation of the recess. The recess may be formed by a drilling or lasering process that may leave shavings or other loose feedthrough plate materials in the recess. A recess without a vent hole may be difficult to clean as any cleaning fluid used to remove debris must enter and exit through the same opening. In contrast, fluid used to clean a recess with a corresponding vent hole may allow fluid to flow from the recess opening to the vent hole opening allowing debris to more easily be removed.

Figure 1:
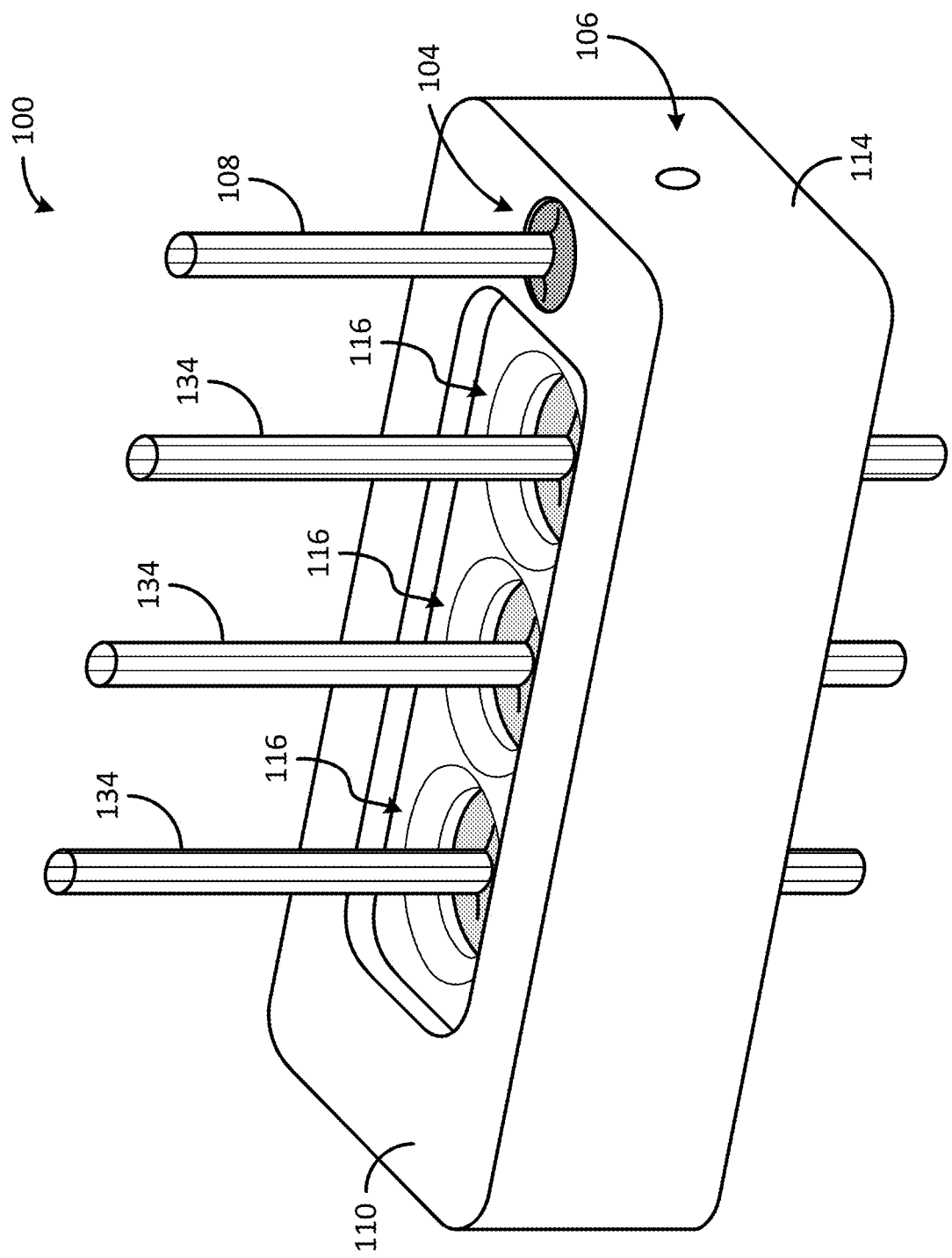
FIG. 1 is a schematic isometric view of a feedthrough component according to embodiments described herein.
Figure 2:
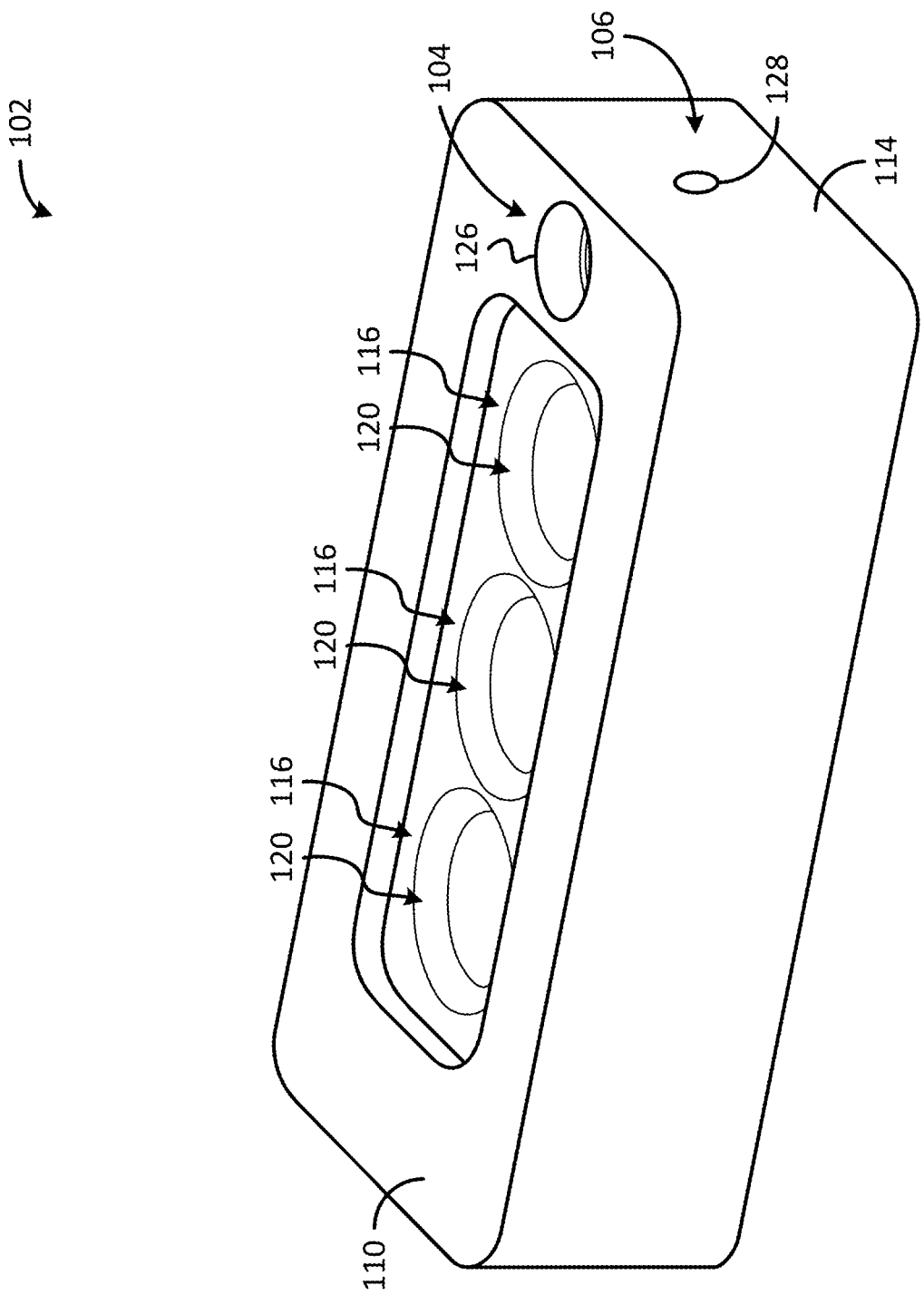
FIG. 2 is a schematic isometric view of a feedthrough plate of the feedthrough component of FIG. 1.
Figure 3:
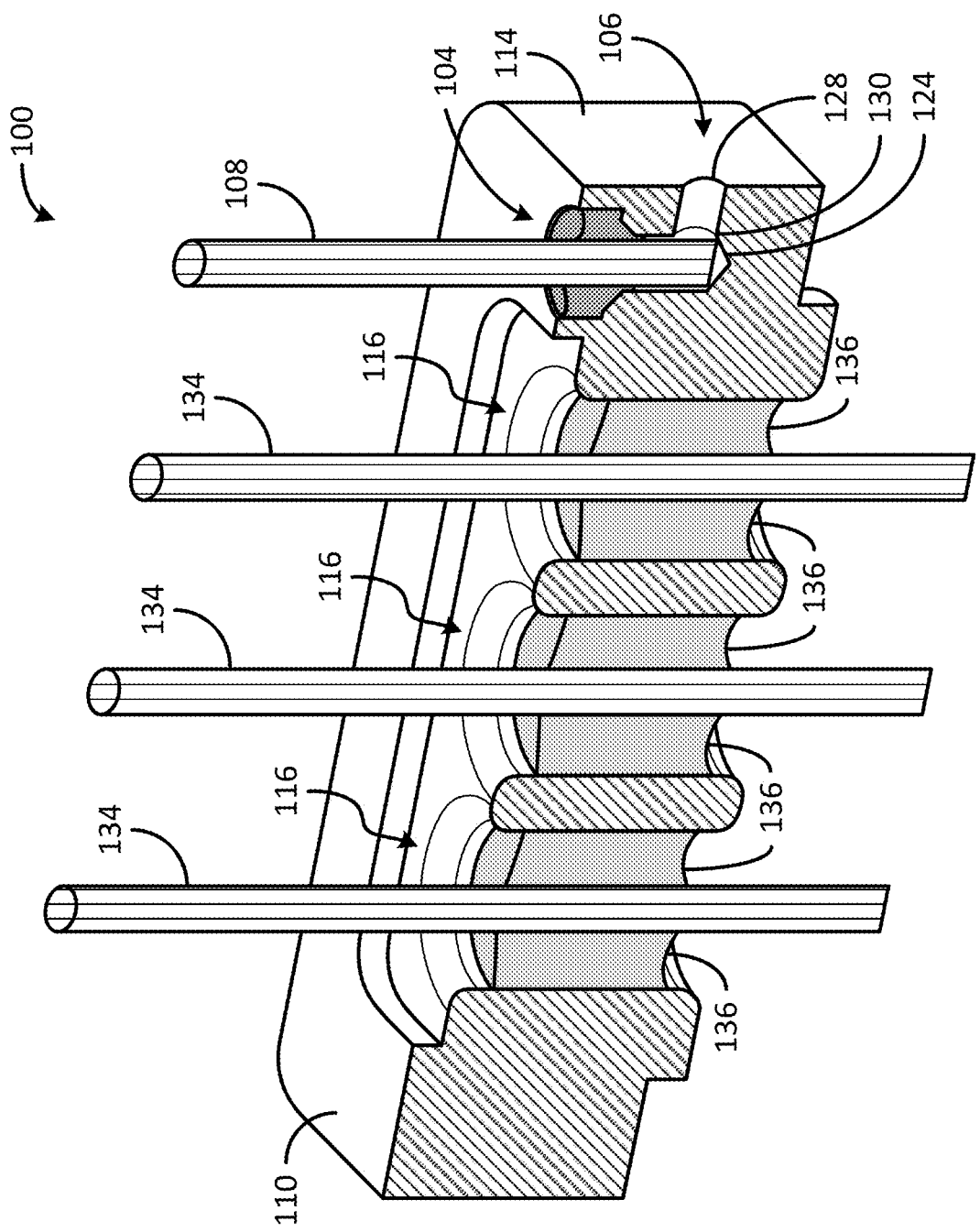
FIG. 3 is a schematic isometric cross-sectional view of the feedthrough component of FIG. 1.
Figure 4:
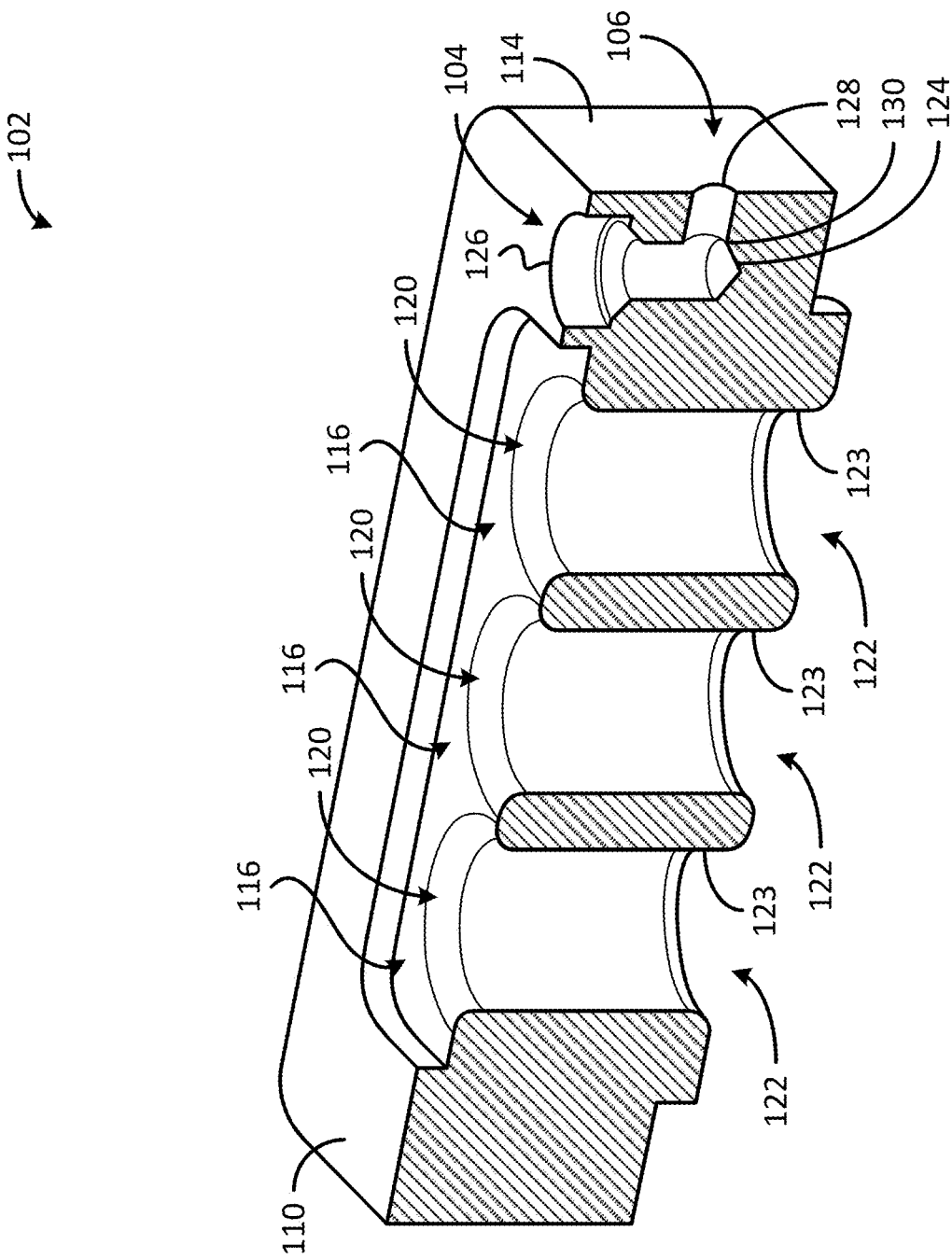
FIG. 4 is a schematic isometric cross-sectional view of the feedthrough pate of FIG. 3.
Figure 5:
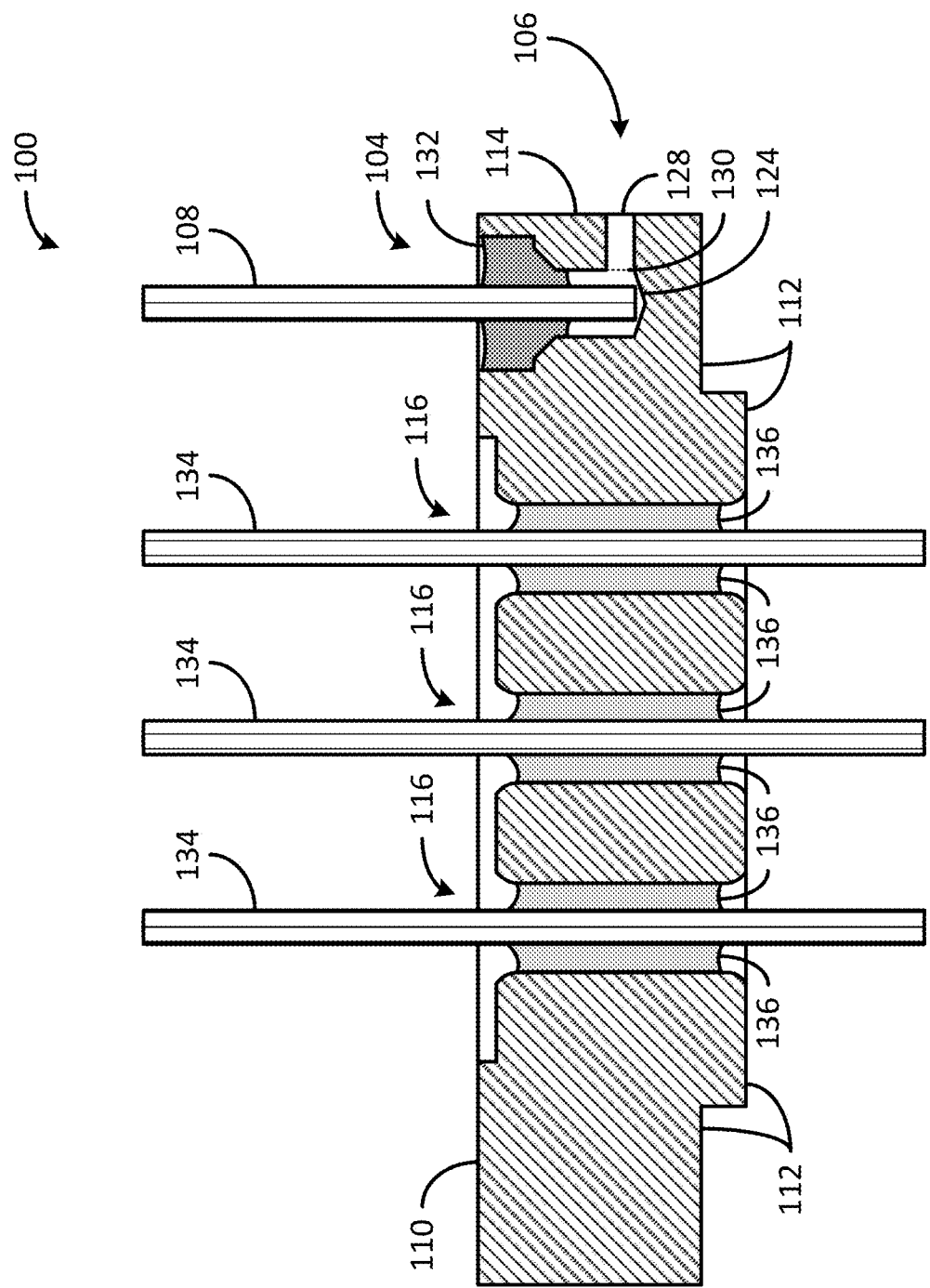
FIG. 5 is a schematic cross-sectional side view of the feedthrough component of FIGS. 1 and 3.
Figure 6:
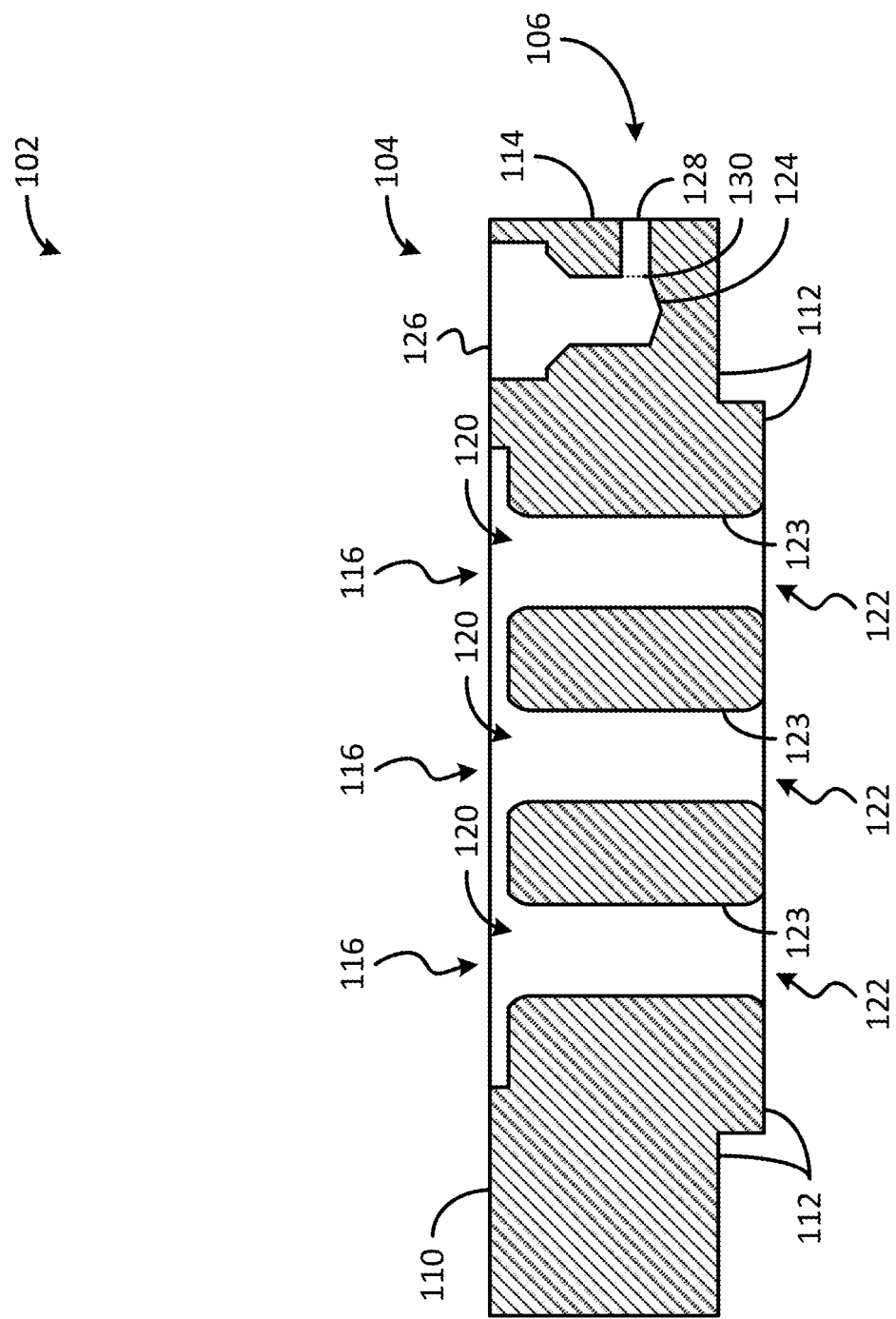
FIG. 6 is a schematic cross-sectional side view of the feedthrough plate of FIG. 5.

A feedthrough plate that includes a recess and a vent hole as described herein is shown in FIGS. 1-6. FIG. 1 shows a schematic perspective view of a feedthrough component 100 that includes a feedthrough plate 102 including a recess 104 and a vent hole 106. FIG. 2 shows a schematic perspective view of the feedthrough plate 102 of FIG. 1. In other words, FIG. 2 shows a schematic perspective view of the feedthrough plate 102 as shown in FIG. 1 without the additional elements of the feedthrough component 100. FIG. 3 shows a schematic cross-sectional perspective view of the feedthrough component 100 of FIG. 1. FIG. 4 shows a schematic cross-sectional perspective view of the feedthrough plate 102 of FIG. 3 without the additional elements of the feedthrough component 100. FIG. 5 shows a schematic cross-sectional side view of the feedthrough component 100 of FIGS. 1 and 3. FIG. 6 shows a schematic cross-sectional side view of the feedthrough plate 102 as shown in FIG. 5 without the additional elements of the feedthrough component 100.

The feedthrough component 100 may include the feedthrough plate 102 and a conductive element 108. The feedthrough plate 102 may include a first major surface 110 and a second major surface 112 opposite the first major surface 110. In other words, the first major surface 110 and the second major surface 112 may define opposing sides or surfaces of the feedthrough plate 102. The feedthrough plate 102 may include a side surface 114 disposed between the first major surface 110 and the second major surface 112. The feedthrough plate 102 may also include at least one through hole 116 extending through the feedthrough plate 102 from the first major surface 110 to the second major surface 112. In other words, each through hole 116 may have a first opening 120 at the first major surface 110 and a second opening 122 at the second major surface 112 (see FIG. 5). Furthermore, one or more sidewalls or surfaces 123 extending from the first opening 120 to the second opening 122 may define a perimeter or circumference of each of the through holes 116.

The feedthrough component 100 may also include one or more feedthrough conductors 134 disposed in one of the through holes. Each feedthrough conductor 134 may extend through one of the through holes 116 and may be coupled to the one or more sidewalls 123 of their respective through hole 116. Each feedthrough conductor 134 may take on any suitable dimensions or define any suitable shape. Each feedthrough conductor 134 may be, for example, an elongate conductor, a wire, a pin, or other conductor capable of providing an electrical connection through the feedthrough plate 102. Each feedthrough conductor 134 may define, for example, a cylindrical shape, a polyhedral shape, or any other suitable shape. Each feedthrough conductor 134 may include any suitable conductive material or materials such as, for example, copper, silver, gold, niobium, titanium, aluminum, or other conductive materials. In one or more embodiments, the feedthrough conductors 134 include niobium. Each feedthrough conductor 134 may provide an electrical connection between electrical circuits or devices within a hermetically sealed enclosure to electrical circuits or devices outside of the hermitically sealed enclosure. In other words, the feedthrough conductors 134 may facilitate operative coupling between electrical circuits or devices within the hermetically sealed enclosure and electrical circuits or devices outside of the hermitically sealed enclosure.

Each feedthrough conductor 134 may be mechanically coupled to one or more sidewalls 123 of a corresponding one of the through holes 116 by an insulative material 136. The insulative material 136 may form a hermetic seal between each feedthrough conductor 134 and the feedthrough plate 102. The insulative material 136 may include any suitable non-conductive material or materials such as, for example, glass, sapphire, ceramics, or other non-conductive materials capable of forming a hermetic seal between the feedthrough conductor 134 and the feedthrough plate 102. In at least one embodiment, the insulative material 136 is a glass seal. The insulative material 136 may have a high electrical resistance. In at least one embodiment, the insulative material 136 has an electrical resistance of at least 50 giga-ohms.

In addition to the through holes 116, the feedthrough plate 102 may include one or more recesses such as, for example, the recess 104. The recess 104 may extend from the first major surface 110 to a recessed surface 124. In other words, the recess 104 may extend from a recess opening 126 in the first major surface 110 to the recessed surface 124. The recessed surface 124 may be disposed between the first major surface 110 and the second major surface 112. In other words, the recess 104 may not extend completely through the feedthrough plate 102. Instead, the recess 104 may extend partially through the feedthrough plate 102 and terminates at the recessed surface 124 located at a position between the first major surface 110 and the second major surface 112. The recessed surface 124 may be non-planer. For example, the recess surface 124 may define an inverted conical shape, a concave shape, a convex shape, or any other suitable shape.

The feedthrough plate 102 may also include a vent hole 106 in fluid communication with the recess 104. The vent hole 106 may extend from the side surface 114 to the recess 104. In other words, the vent hole 106 may extend from a vent opening 128 in the side surface 114 to a sidewall opening 130 in a sidewall 144 of the recess 104. The vent hole 106 may define a fluid pathway from the opening 128 to the opening 126 that can allow fluid or other fluids to flow out of the recess 104 even if a portion of the recess 104 or the recess opening 126 is blocked or otherwise filled. For example, a portion of the recess 104 or the recess opening 126 may be filled by, for example, attachment material, conductive elements, or other materials. The vent opening 128 may be disposed at any suitable location in the side surface 114. Although depicted as being disposed in the side surface 114 at a position opposite the through holes 116 such that the recess 104 is located between the vent hole 106 and the through holes 116, the vent opening 128 may be disposed in the side surface 114 at other locations. For example, the vent opening 128 may be disposed at any location in the side surface 114 such that a straight line extending from the vent opening 128 to the recess 104 does not intersect one of the through holes 116.

The conductive element 108 of the feedthrough component 100 may be at least partially disposed in the recess 104 and electrically coupled to the feedthrough plate 102.

The conductive element 108 may take on any suitable dimensions or define any suitable shape. The conductive element 108 may be, for example, an elongate conductor, a wire, a pin, or other conductor capable of being mechanically and electrically coupled to the feedthrough plate 102. The conductive element 108 may define, for example, a cylindrical shape, a polyhedral shape, or any other suitable shape. The conductive element 108 may include any suitable conductive material or materials such as, for example, copper, silver, gold, niobium, titanium, aluminum, or other conductive materials. In one or more embodiments, the conductive element 108 includes niobium. The conductive element 108 may provide an electrical connection between electrical circuits or devices within a hermetically sealed enclosure to feedthrough plate 102. In one or more embodiments, the conductive element 108 and feedthrough plate 102 may serve as an electrical ground for an electronic device.

The conductive element 108 may be electrically coupled to the feedthrough plate 102 by attachment material 132 disposed in the recess 104. In other words, the feedthrough component 100 may include attachment material 132 disposed in the recess 104. As used herein, the term "attachment material" may refer to electrically conductive materials that can be used to electrically and mechanically couple things together. The attachment material 132 may include any suitable conductive material or materials such as, for example, copper, gold, tin, lead, silver, indium, or other conductive materials. In one or more embodiments, the attachment material 132 may be a eutectic solder or brazing material. In other words, the attachment material 132 may include an alloy that melts and freezes at a single temperature. The particular melting and/or freezing point of the attachment material 132 may depend on the material composition of the attachment material 132. In one or more embodiments, the attachment material 132 may have a melting point of at least 180 degrees Celsius and no greater than 1,200 degrees Celsius. In addition to electrically coupling the conductive element 108 to the feedthrough plate 102, the attachment material 132 may also mechanically couple the conductive element 108 to the feedthrough plate 102.

As shown, the attachment material 132 may obstruct or block the flow of fluid from the recess 104 to the recess opening 126. Processes that subject the feedthrough plate 102 and attachment material 132 to relatively high temperatures (e.g., above a melting point of the attachment material 132) may cause fluid in the recess 104 to expand. When the fluid in the recess 104 expands, the vent hole 106 may provide a fluid pathway of least resistance for the expanding fluid to escape the recess 104. In contrast, expanding fluid trapped within recess without a corresponding vent hole may force melting or melted attachment material out of such recess along with any other conductive elements such as, for example, an conductive element.

Figure 7:
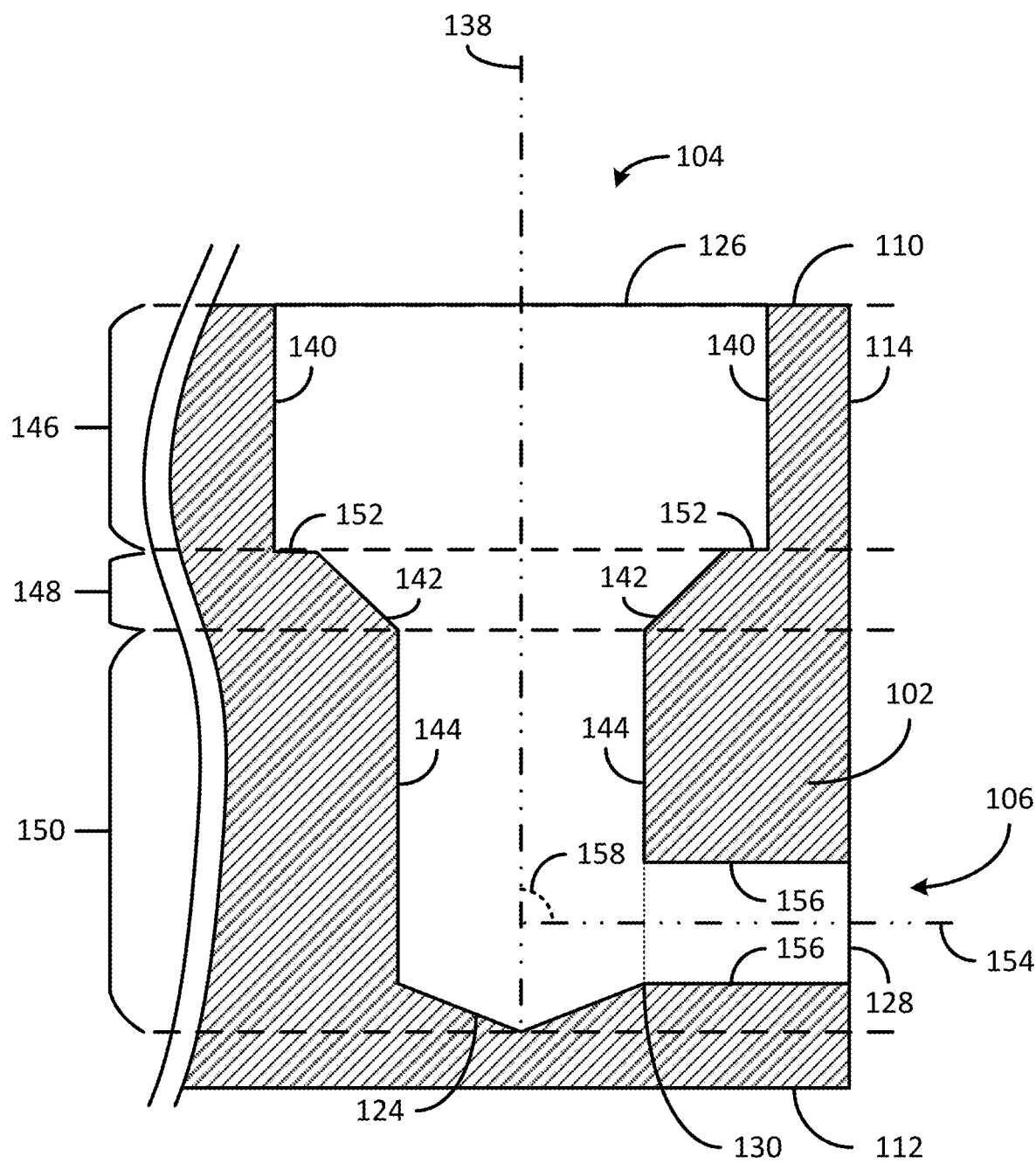
FIG. 7 is a schematic cross-sectional view of a recess and vent hole of the feedthrough plate of FIGS. 1-6.

The recess 104 and the vent hole 106 are depicted in greater detail in FIG. 7. FIG. 7 shows a cross-sectional side view of a portion of the feedthrough plate that includes the recess 104 and the vent hole 106. The recess 104 may extend from the recess opening 126 to the recessed surface 124 along a recess axis 138. The recess 104 may take on any suitable size or shape. The recess 104 may be, for example, cylindrical, frustoconical, prismatic, cuboid, or any combination thereof. For example, some portions of the recess 104 may be cylindrical while other portions may be frustoconical (e.g., a portion that tapers from one outer diameter to another). The general shape of the recess 104 may be defined by a plurality of sidewalls 140, 142, 144. The plurality of sidewalls 140, 142, 144 may be inner surfaces of the recess 104. The recess 104 may include a proximal recess portion 146, a tapered portion 148, and distal recess portion 150. The proximal recess portion 146 may be defined by one or more proximal sidewalls 140 of the plurality of sidewalls and extends along the recess axis 138. The distal recess portion 150 may be defined by one or more distal sidewalls 144 and extends along the recess axis 138.

Each of the proximal recess portion 146 and the distal recess portion 150 may include one or more diameters or cross-sectional areas that are arranged perpendicular to the recess axis 138. The one or more diameters or cross-sectional areas of the proximal recess portion 146 may be defined by the one or more proximal sidewalls 140. Similarly, the one or more diameters or cross-sectional areas of the distal recess portion 150 may be defined by the one or more distal sidewalls 140. As shown, diameters or cross-sectional areas of the proximal recess portion 146 are smaller than a diameter or cross-sectional area of the distal recess portion 150. However, the diameters or cross-sectional areas of the proximal recess portion 146 and the distal recess portion 150 may be equal to one another. Furthermore, the diameter or cross-sectional area of the proximal recess portion 146 may be greater than the diameter or cross-sectional area of the distal recess portion 150. Still further, the diameters or cross-cross section areas of the proximal recess portion 146 and the distal recess portion 150 may vary along the length of such portions. For example, such diameters or cross-cross sectional areas may be tapered when the plurality of sidewalls 140, 142, 144 extend non-parallel to the recess axis 138.

The tapered recess portion 148 is disposed between the proximal recess portion 146 and the distal recess portion 150. Additionally, the tapered recess portion 148 extends from the one or more distal sidewalls 140 toward the recess axis 138. Furthermore, the tapered recess portion 148 includes the tapered sidewall 142 defining a beveled surface that extends toward the recess axis 138. The tapered sidewall 142 may extend towards the recess axis 138 at a non-perpendicular angle relative to the longitudinal axis or be curved in some manner. Additionally, a normal to the tapered sidewall 142 may intersect the recess axis 138. The normal to the tapered sidewall 142 may define an acute angle relative to the longitudinal axis of at least 10 degrees and no greater than 70 degrees.

The tapered recess portion 148 can take on any suitable size or shape. Although shown with a flat surface 152 and the tapered sidewall 142, the tapered recess portion 148 may include any number of suitable planar or curved surfaces. In one or more embodiments, the tapered sidewall 142 can also be curved. For example, the tapered sidewall 142 can be convex or concave. Additionally, the tapered sidewall 142 may include one or more surface features (not shown). Surface features may include, for example, a serpentine portion (e.g., convex and concave portions), ridges, bumps, dimples, or other surface shapes or features. Regardless of any surface feature or curvature the tapered sidewall 142, a plane that intersects both the first endpoint of the tapered sidewall 142 and a second endpoint of the tapered sidewall 142 may form an acute angle with the longitudinal axis of at least 20 degrees and no greater than 80 degrees. In at least one embodiment, the tapered sidewall 142 is planar. In at least one embodiment, the tapered sidewall 142 is convex.

The sidewall opening 130 may be defined in any one of the plurality of sidewalls 140, 142, 144. As shown, the sidewall opening 130 is defined in the distal recess sidewall 144. In general, a diameter of the sidewall opening 130 may be smaller than a diameter of the recess 104. As shown, the diameter of the sidewall opening 130 is smaller than the diameter of the distal recess portion 150. The sidewall opening 130, depicted as a dotted line, may allow for fluid communication between the recess 104 and the vent hole 106.

The vent hole 106 may extend from the vent opening 128 in the side surface 114 to the sidewall opening 130 along a vent axis 154. The vent axis 154 may be a central axis or longitudinal axis of the vent hole 106. An angle 158 may be defined by the intersection of the recess axis 138 and the vent axis 154. The angle 158 may be at least 60 degrees and no greater than 120 degrees. In other words, an acute angel formed by the intersection of the recess axis 138 and the vent axis 154 may be no less than 60 degrees and an obtuse angle formed by such intersection may be no greater than 120 degrees.

The vent hole 106 may be defined by one or more vent hole sidewalls 156 that extend from the vent opening 128 to the sidewall opening 130. The vent hole 106 may take on any suitable size or shape. The vent hole 106 may be, for example, cylindrical, frustoconical, prismatic, cuboid, or any combination thereof. For example, some portions of the vent hole 106 may be cylindrical while other portions may be frustoconical (e.g., a portion that tapers from one outer diameter to another). The general shape of the vent hole 106 may be defined by the one or more vent hole sidewalls 156.

Figure 8:
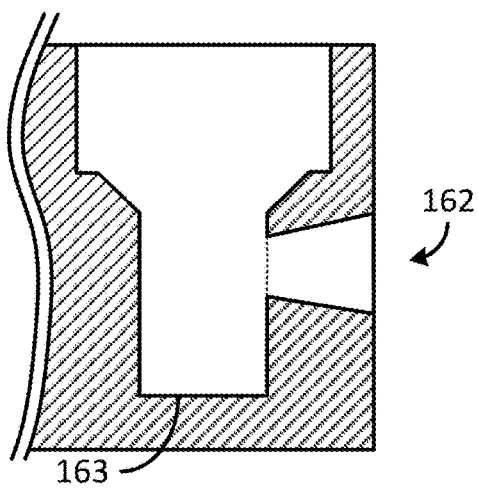
FIG. 8 is a schematic cross-sectional view of another recess and vent hole according to embodiments described herein.
Figure 9:
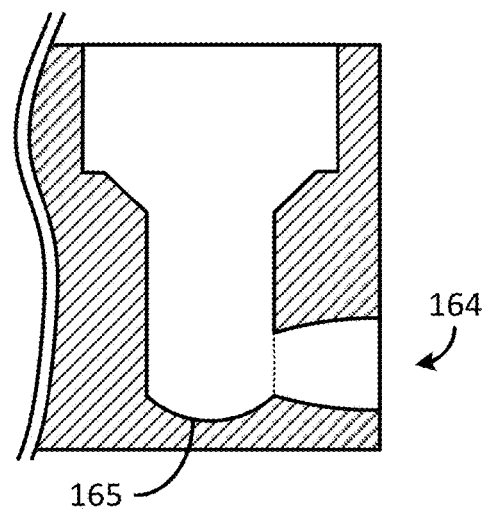
FIG. 9 is a schematic cross-sectional view of another recess and vent hole according to embodiments described herein.
Figure 10:
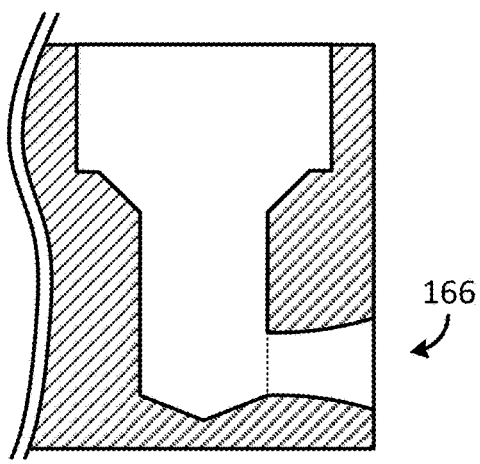
FIG. 10 is a schematic cross-sectional view of yet another recess and vent hole according to embodiments described herein.
Figure 11:
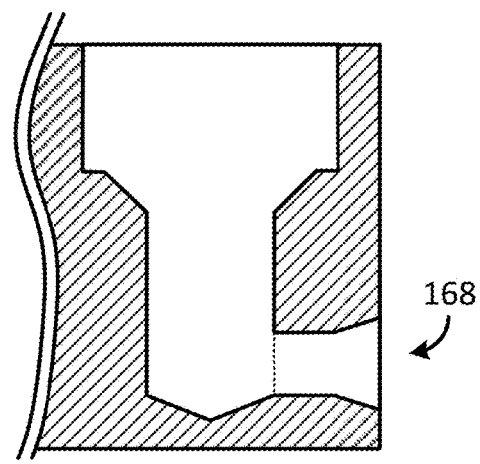
FIG. 11 is a schematic cross-sectional view of still another recess and vent hole according to embodiments described herein.

Examples of various shapes that the vent hole 106 may take on are depicted in FIGS. 8-11. FIG. 8 depicts a vent hole 162 with a frustoconical shape. FIG. 9 depicts a vent hole 164 with concave sidewalls. FIG. 10 depicts a vent hole 166 with convex sidewalls. FIG. 11 depicts a vent hole 168 with a combination cylinder and frustoconical shape. The vent hole 106 may take on any of the shapes or combination of the shapes of the vent holes 162, 164, 166, 168.

In addition to the various shapes that the vent hole 106 may take on, the vent hole may have any suitable vertical positioned relative to the recess 104. In other words, the sidewall opening 130 may be positioned at any suitable vertical location relative to the recess 104. For example, the vent hole 106 may be positioned closer to the tapered recess portion 148 than the recessed surface 124 similar to the vent hole 162 of FIG. 8.

The recessed surface 124 may also take on any suitable dimensions or define any shapes. For example, the recessed surface 124 may be planar similar to the recessed surface 163 of FIG. 8. The recessed surface 124 may also define a curved shape such as the concave shape of a recessed surface 165 shown in FIG. 9. The shape of the recessed surface 124 may define, for example, an inverted conical shape, a concave shape, a convex shape, or any other suitable shape.

Figure 12:
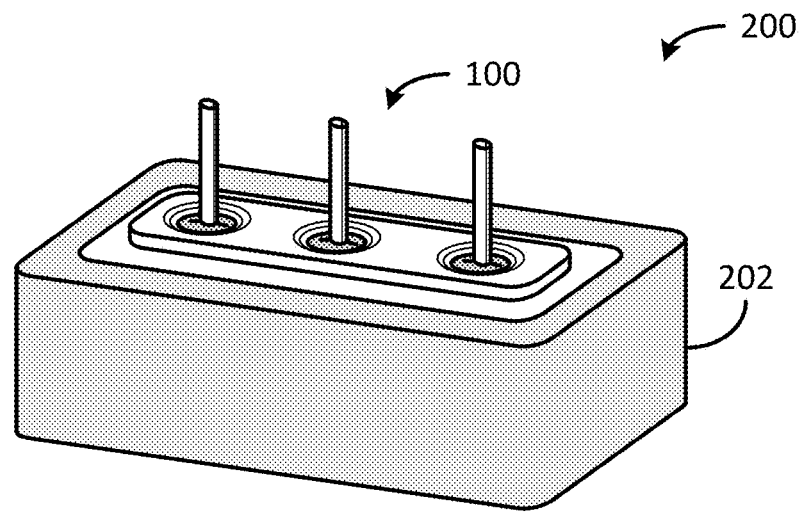
FIG. 12 is a schematic perspective view of an implantable medical device that includes a feedthrough component.
Figure 13:
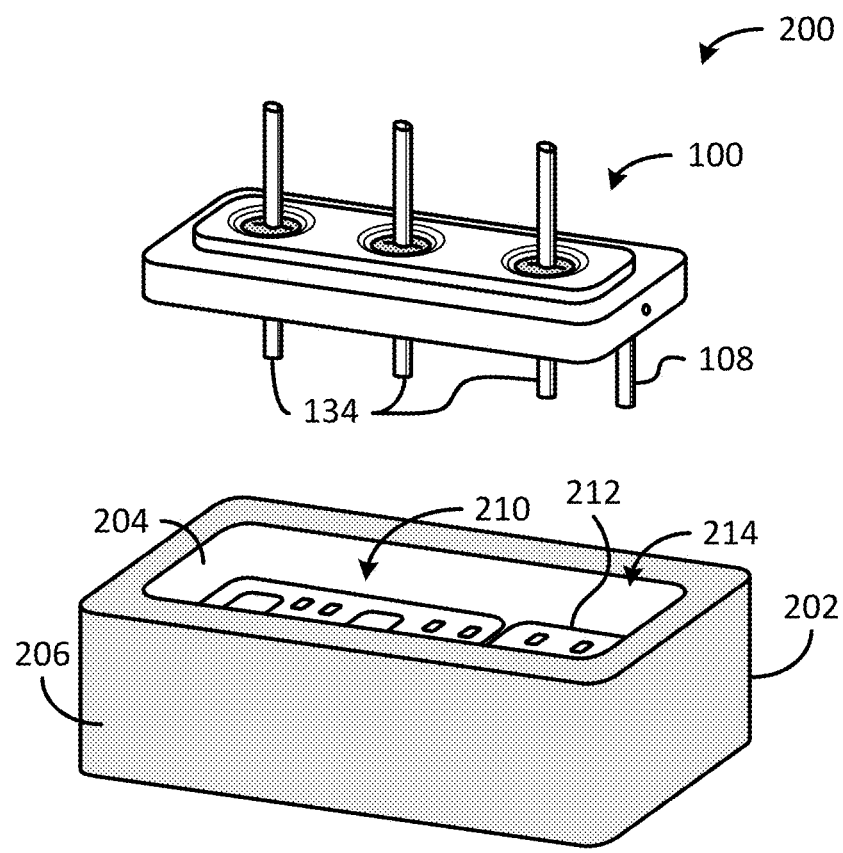
FIG. 13 is a schematic exploded view of the implantable medical device of FIG. 11.

The feedthrough component 100 may be used in feedthrough assemblies and/or implantable medical devices as those shown in FIGS. 12 and 13. FIGS. 12 and 13 are various schematic views of one embodiment of an implantable medical device 200 that may utilize one or more feedthrough components with a vent hole as described herein (e.g., feedthrough component 100 of FIGS. 1, 3, and 5). FIG. 12 is a schematic perspective view of the implantable medical device 200. FIG. 13 is a schematic exploded view of the implantable medical device 200.

The implantable medical device 200 may include a housing 202. The housing 202 may include an inner surface 204 and an outer surface 206. The implantable medical device 200 may also include at least one electronic device 210 disposed in the housing 202. The implantable medical device 200 also includes a power source 212 that is disposed at least partially within the housing 202. In one or more embodiments, the power source 212 can be disposed within a cavity 214 of the housing 202. The power source 212 may include one or more power source contacts that can be operatively coupled to the electronic device 210, any of the feedthrough conductors 134, or the conductive element 108.

The feedthrough plate 102 can be sealed to the housing 202 to form a hermetic seal as described in co-owned U.S. Pat. No. 10,880,009 to Nielsen et al. and entitled METHOD OF FORMING A SEALED PACKAGE, which is incorporated by reference in its entirety. In one or more embodiments, the feedthrough plate 102 can be hermetically sealed to the housing 202. Further, in one or more embodiments, the feedthrough plate 102 can be sealed to the housing 202 such that a non-bonded electrical connection can be formed between one or more device contacts and one or more power source contacts. When the feedthrough plate 102 is sealed to the housing 202, the vent hole 106 may face the inner surface 204 of the housing 202. In one or more embodiments, the side surface 114 of the feedthrough plate 102 is welded to the device housing such that a weld line covers the vent hole 106.

The invention is defined in the claims. However, below there is provided a non-exhaustive list of non-limiting examples. Any one or more of the features of these examples may be combined with any one or more features of another example, embodiment, or aspect described herein.

Example Ex1: A feedthrough component comprising: a feedthrough plate comprising: a first major surface; a second major surface opposite the first major surface; a side surface disposed between the first major surface and the second major surface; at least one through hole extending through the feedthrough plate from the first major surface to the second major surface; a recess extending from the first major surface to a recessed surface, the recessed surface disposed between the first major surface and the second major surface; a vent hole extending from the side surface to the recess, the vent hole in fluid communication with at least a portion of the recess; a conductive element at least partially disposed in the recess and electrically coupled to the feedthrough plate.

Example Ex2: The feedthrough component as in example Ex1, further comprising attachment material disposed in the recess and electrically coupling the conductive element to the feedthrough plate.

Example Ex3: The feedthrough component as in example Ex2, wherein the attachment material is eutectic solder.

Example Ex4: The feedthrough component as in any one of the previous examples, wherein the recessed surface is non planer.

Example Ex5: The feedthrough component as in any one of the previous examples, wherein a cross-sectional area of the recess is greater than a cross-sectional area of the vent hole.

Example Ex6: The feedthrough component as any one of the previous examples, wherein: the recess extends along a recess axis; the vent hole extends along a vent axis; and an intersection of the recess axis and the vent axis defines an acute angle of at least 60 degrees.

Example Ex7: The feedthrough component as in any one of examples Ex1 to Ex6, wherein vent hole is defines a frustoconical shape.

Example Ex8: The feedthrough component as in any one of examples Ex1 to Ex6, wherein the vent hole defines a cylindrical shape.

Example Ex9: The feedthrough component as in any one of examples Ex1 to Ex6, wherein the vent hole is defined by one or more convex sidewalls.

Example Ex10: The feedthrough component as in any one of examples Ex1 to Ex6, wherein vent hole is defined by one or more concave sidewalls.

Example Ex11: The feedthrough component as in any one of the previous examples, wherein the feedthrough plate comprises titanium.

Example Ex12: The feedthrough component as in any one of the previous examples, further comprising a feedthrough conductor extending through the at least one through hole and coupled to the feedthrough plate.

Example Ex13: The feedthrough component as in example Ex12, further comprising an insulative material mechanically coupling the feedthrough conductor to the feedthrough plate and forming a hermetic seal.

Example Ex14: An implantable medical device comprising: a housing; a feedthrough component as in any one of the previous examples, the feedthrough component welded to the device housing to form a hermetic seal; and one or more electrical components disposed in the housing and operatively coupled to the conductive element of the feedthrough component.

Example Ex15: The implantable medical device as in example Ex14, wherein the side surface of the feedthrough plate is welded to the device housing such that a weld line covers the vent hole.

Example Ex16: A feedthrough plate comprising: a first major surface; a second major surface opposite the first major surface; a side surface disposed between the first major surface and the second major surface; a recess extending from the first major surface to a recessed surface, the recessed surface disposed between the first major surface and the second major surface; and a vent hole extending from the side surface to the recess, the vent hole in fluid communication with at least a portion of the recess.

Example Ex17: The feedthrough plate as in example Ex16, wherein the recessed surface is non planer.

Example Ex18: The feedthrough plate as in any one of examples Ex16 or Ex17, wherein the feedthrough plate comprises titanium.

Example Ex19: The feedthrough plate as in any one of examples Ex16 to Ex18, wherein a cross-sectional area of the recess is greater than a cross-sectional area of the vent hole.

Example Ex20: The feedthrough plate as in any one of examples Ex16 to Ex19, wherein: the recess extends along a recess axis; the vent hole extends along a vent axis; and an intersection of the recess axis and the vent axis defines an acute angle of at least 60 degrees.

Example Ex21: The feedthrough plate as in any one of examples Ex16 to Ex20, wherein vent hole is defines a frustoconical shape.

Example Ex22: The feedthrough plate as in any one of examples Ex16 to Ex20, wherein the vent hole defines a cylindrical shape.

Example Ex23: The feedthrough plate as in any one of examples Ex16 to Ex20, wherein the vent hole is defined by one or more convex sidewalls.

Example Ex24: The feedthrough plate as in any one of examples Ex16 to Ex20, wherein vent hole is defined by one or more concave sidewalls.

Example Ex25: The feedthrough plate as in any one of examples Ex16 to Ex24, at least one through hole extending through the feedthrough plate from the first major surface to the second major surface.

All references and publications cited herein are expressly incorporated herein by reference in their entirety into this disclosure, except to the extent they may directly contradict this disclosure. Illustrative embodiments of this disclosure are discussed, and reference has been made to possible variations within the scope of this disclosure. These and other variations and modifications in the disclosure will be apparent to those skilled in the art without departing from the scope of the disclosure, and it should be understood that this disclosure is not limited to the illustrative embodiments set forth herein. Accordingly, the disclosure is to be limited only by the claims provided below.

What is claimed is:

1. A feedthrough component comprising:
    a feedthrough plate comprising:
        a first major surface;
        a second major surface opposite the first major surface, wherein the feedthrough plate defines at least one through hole extending through the feedthrough plate from the first major surface to the second major surface, the at least one through hole configured to receive a feedthrough conductor that extends therethrough;
        a side surface disposed between the first major surface and the second major surface, the side surface forming part of an exterior surface of the feedthrough plate;
        a recessed surface disposed between the first major surface and the second major surface, the feedthrough plate defining a recess extending from the first major surface to the recessed surface, the recess configured to receive a conductive element at least partially within the recess that electrically couples to the feedthrough plate; and
        at least one vent hole sidewall disposed between the side surface and the recess, the at least one vent hole sidewall defining a vent hole extending from the side surface to the recess, the vent hole in fluid communication with at least a portion of the recess.

2. The feedthrough component as in claim 1, further comprising a conductive element at least partially disposed in the recess and electrically coupled to the feedthrough plate.

3. The feedthrough component as in claim 2, further comprising attachment material disposed in the recess and electrically coupling the conductive element to the feedthrough plate.

4. The feedthrough component as in claim 3, wherein the attachment material is eutectic solder.

5. The feedthrough component as in claim 1, wherein the recessed surface is non-planer.

6. The feedthrough component as in claim 1, wherein a cross-sectional area of the recess is greater than a cross-sectional area of the vent hole.

7. The feedthrough component as in claim 1, wherein:
    the recess extends along a recess axis;
    the vent hole extends along a vent axis; and
    an intersection of the recess axis and the vent axis defines an acute angle of at least about 60 degrees.

8. The feedthrough component as in claim 1, wherein the at least one vent hole sidewall defines a frustoconical shape.

9. The feedthrough component as in claim 1 wherein the at least one vent hole sidewall defines a cylindrical shape.

10. The feedthrough component as in claim 1, wherein the at least one vent hole sidewall defines a convex shape.

11. The feedthrough component as in claim 1, wherein the at least one vent hole sidewall defines a concave shape.

12. The feedthrough component as in claim 1, wherein the feedthrough plate comprises titanium.

13. The feedthrough component as in claim 1, further comprising a feedthrough conductor extending through the at least one through hole and coupled to the feedthrough plate.

14. The feedthrough component as in claim 13, further comprising an electrically insulative material mechanically coupling the feedthrough conductor to the feedthrough plate and forming a hermetic seal.

15. The feedthrough component as in claim 1, wherein the recess is defined by at least:
    a first recess portion directly adjacent to the first major surface, the first recess portion comprising a first recess sidewall, the first recess sidewall defining a first cross-sectional length; and
    a second recess portion between the first recess portion and the second major surface, the second recess portion comprising a second recess sidewall and the recessed surface, the second recess sidewall defining a second cross-sectional length, wherein, the first cross-sectional length is greater than the second cross-sectional length.

16. The feedthrough component as in claim 15, wherein the recess is further defined by:

a third recess portion directly adjacent and between the first recess portion and the second recess portion, the third recess portion comprising one or more surfaces that connect the first recess sidewall and the second recess sidewall.

17. The feedthrough component as in claim 16, wherein the one or more surfaces of the third recess portion comprise a tapered surface.

18. An implantable medical device comprising:

a device housing;

a feedthrough component as in claim 1, the feedthrough component welded to the device housing to form a hermetic seal; and one or more electrical components disposed in the housing and operatively coupled to the conductive element of the feedthrough component.

19. The implantable medical device as in claim 1, wherein the side surface of the feedthrough plate is welded to the device housing such that a weld line covers the vent hole.

* * * * *